(12) United States Patent
Chen et al.

(10) Patent No.: US 7,864,092 B2
(45) Date of Patent: Jan. 4, 2011

(54) THERMO-DECODER CIRCUIT

(75) Inventors: Jinfu Chen, Shanghai (CN); Pengfei Hu, Shanghai (CN); Qinghua Yue, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 29 days.

(21) Appl. No.: 12/367,410

(22) Filed: Feb. 6, 2009

(65) Prior Publication Data

US 2010/0201557 A1 Aug. 12, 2010

(51) Int. Cl.
*H03M 1/66* (2006.01)
(52) U.S. Cl. .......................................... 341/144; 345/97
(58) Field of Classification Search .................. 341/144, 341/133, 145, 150, 153, 154, 148, 136; 345/89–92, 345/97
See application file for complete search history.

(56) References Cited

U.S. PATENT DOCUMENTS

| | | | |
|---|---|---|---|
| 7,176,825 B2 * | 2/2007 | Yoon | 341/153 |
| 7,586,429 B1 * | 9/2009 | Cerusa et al. | 341/144 |
| 7,605,734 B2 * | 10/2009 | Bult et al. | 341/144 |

* cited by examiner

*Primary Examiner*—Brian Young
(74) *Attorney, Agent, or Firm*—Haynes and Boone LLP (57) ABSTRACT

A digital-to-thermometer-code converter is disclosed for converting a digital signal into its thermometer-code equivalent. Embodiments of the digital-to-thermometer-code include a binary-to-control signal converter that generates a column control signal and a row control signal based on a binary input signal, and a control signal-to-thermometer-code decoder that includes an array of decoder circuit blocks coupled to receive the column control signal and the row control signal, wherein each of the decoder circuit blocks determine at least one bit of the thermometer-code output signal based on at least a first bit of the column control signal.

27 Claims, 5 Drawing Sheets

THERMO-DECODER CIRCUIT

BACKGROUND

1. Technical Field

Th present invention relates to thermometer-code signal conversion and, in particular, to a thermo-decoder circuit capable of converting a binary signal to a corresponding thermometer-code signal.

2. Discussion of Related Art

Modern electronics often require interfacing signals between analog and digital systems. For example, a digital audio signal is converted into an analog signal prior to playing the signal through an audio speaker. Similarly, many digital video signals from digital media sources are converted to an analog form prior to viewing on an analog display. Accordingly, digital signals are converted into their analog equivalents in many electronic devices.

Digital-to-analog converters ("DACs") are widely used to convert a digital signal into a corresponding analog signal, thereby allowing for communication between analog and digital systems. Some DAC designs, however, exhibit poor performance due to inherent integral non-linearity ("INL") and differential non-linearity ("DNL") responses. To minimize response errors caused by these non-linearities, a DAC that integrates a binary-to-thermometer-code ("thermo-code") converter and a thermo-code-to-analog converter may be used. The design of such binary-to-thermo code converters, however, typically require increased layout area and additional routing complexity on the chip.

Therefore, it is desirable to develop binary-to-thermo code converters having reduced layout area and routing complexity requirements that may be integrated into a thermo-to-analog converter to achieve binary-to-analog signal conversion.

SUMMARY

Consistent with some embodiments of the present invention, a binary-to-thermometer-code converter includes a binary-to-control signal converter that generates a column control signal and a row control signal based on a binary input signal, and a control signal-to-thermometer-code decoder that includes an array of decoder circuit blocks coupled to receive the column control signal and the row control signal, wherein each of the decoder circuit blocks determine at least one bit of the thermometer-code output signal based on at least a first bit of the column control signal.

Consistent with some embodiments of the present invention, a binary-to-analog converter includes a binary-to-control signal converter that generates a column control signal and a row control signal based on a binary input signal, a control signal-to-thermometer-code decoder that includes an array of decoder circuit blocks coupled to receive the column control signal and the row control signal, wherein each of the decoder circuit blocks determine at least one bit of the thermometer-code output signal based on at least one bit a first bit of the column control signal, and a thermometer-code-to-analog converter coupled to receive the thermometer-code output signal and generate a corresponding analog output signal.

Consistent with some embodiments of the present invention, a method includes generating, based on a received digital signal, a column control signal and a row control signal, and generating, utilizing a control signal-to-thermometer-code decoder that includes an array of decoder circuit blocks coupled to receive the column control signal and row control signal, a thermometer-code output signal based on at least a first bit of the column control signal. In some embodiments, the method may include generating, utilizing a thermometer-code-to analog converter, an analog signal based on the thermometer-code output signal.

Further embodiments and aspects of the invention are discussed with respect to the following figures, which are incorporated in and constitute a part of this specification.

In the figures, elements having the same designation have the same or similar functions.

DETAILED DESCRIPTION

Figure 1:
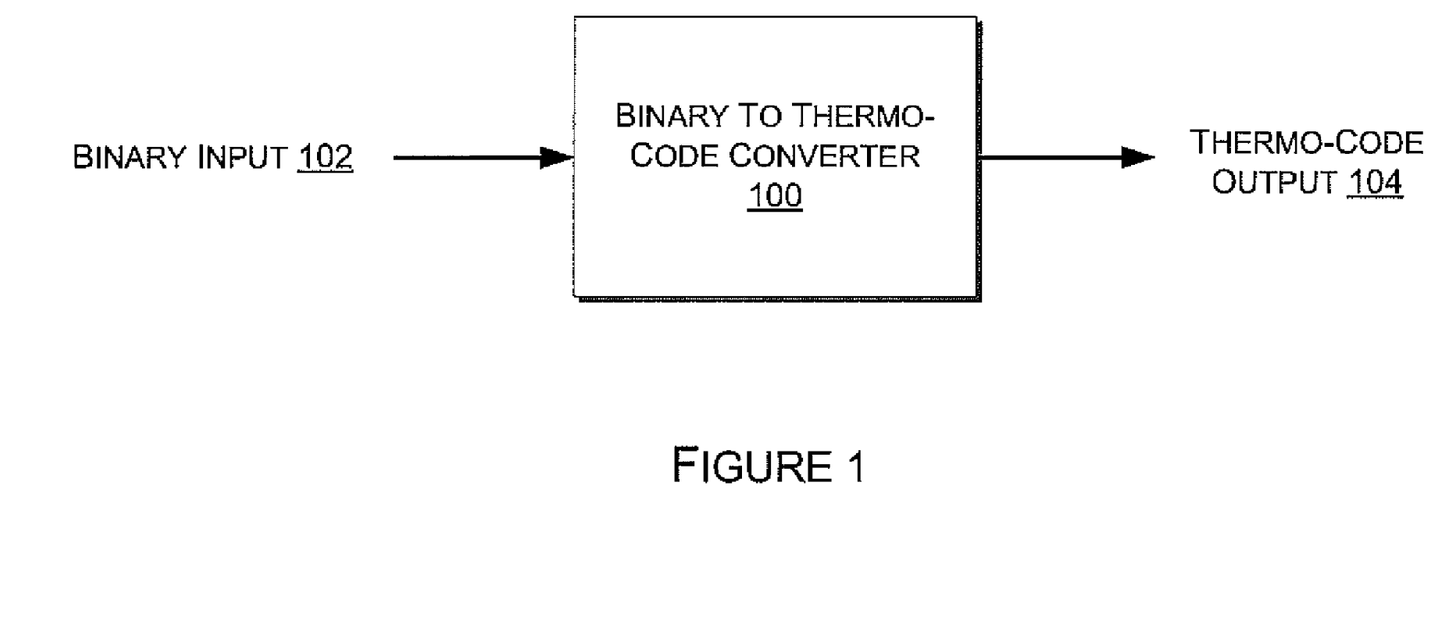
FIG. 1 illustrates a generalized block diagram of a binary-to-thermometer-code ("thermo-code") converter consistent with some embodiments of the present invention.

FIG. 1 illustrates a generalized block diagram of a binary-to-thermometer-code ("binary-to-thermo") converter 100 consistent with some embodiments of the present invention. A binary signal 102 (e.g., a digital signal) is provided to binary-to-thermo converter 100 as an input signal. In some embodiments, binary signal 102 is a digital signal representing a digital word of any bit length. Based on the received binary input signal 102, binary-to-thermo converter 100 generates a corresponding thermometer-code ("thermo-code") output signal 104. In some embodiments, thermo-code output 104 is the thermo-code representation of a digital word provided to binary-to-thermo converter 100 as a digital input.

Figure 2:
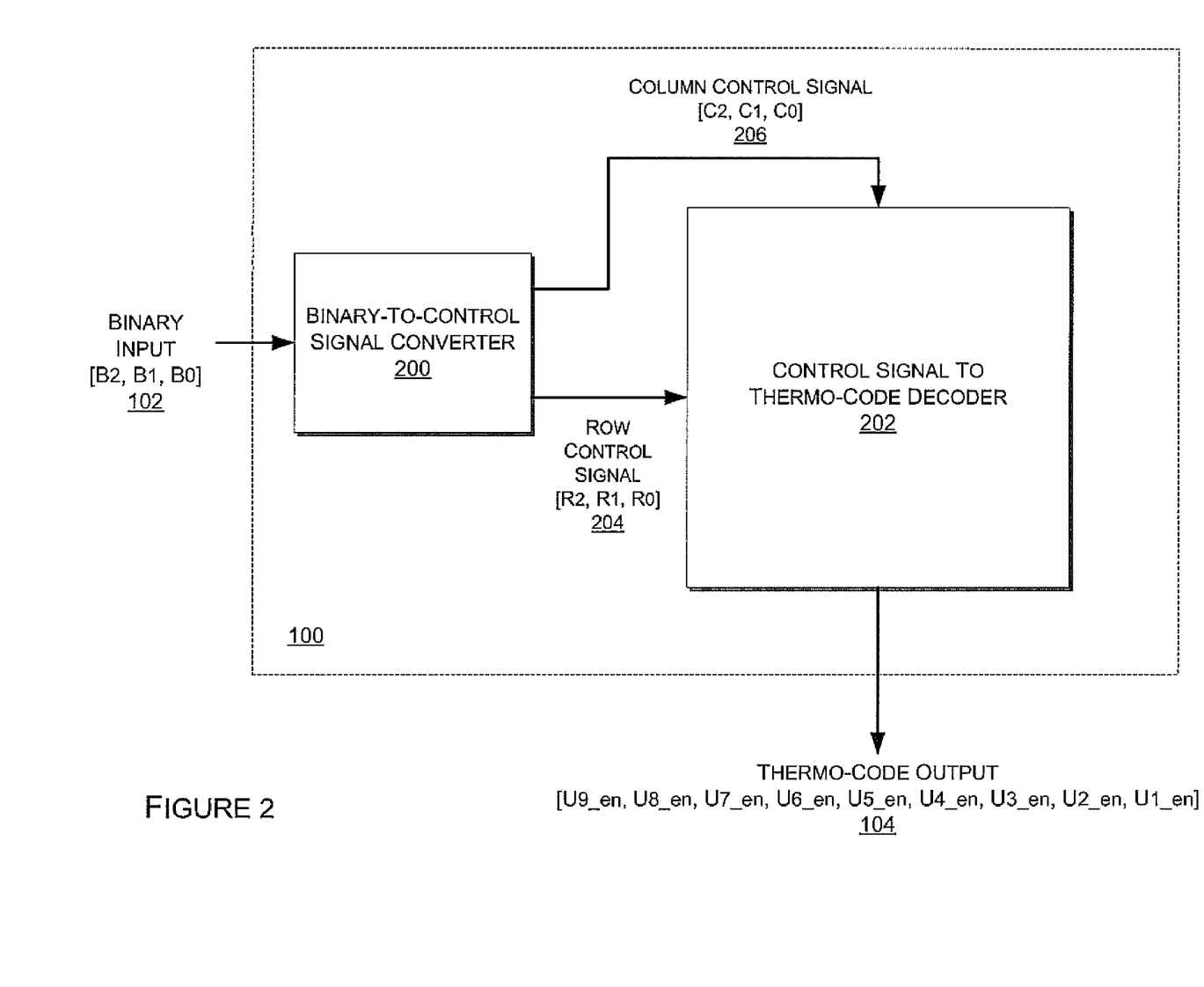
FIG. 2 illustrates a schematic diagram of a binary-to-thermo-code converter consistent with some embodiments of the present invention.

FIG. 2 illustrates a schematic diagram of a binary-to-thermo converter 100 consistent with some embodiments of the present invention. Binary-to-thermo converter 100 includes binary-to-control signal converter 200 and control signal-to-thermo-code decoder ("thermo-decoder") 202. Binary-to-control signal converter 200 receives binary signal 102 as an input. In some embodiments, binary input signal 102 may represent a 3-bit binary word [$B_2$, $B_1$, $B_0$]. While this specification describes binary-to-thermo converter 100 in the context of converting a 3-bit binary input signal into a corresponding thermo-code signal, principles consistent with embodiments described herein may be utilized to convert a binary input signal of any length into a corresponding thermo-code signal.

As illustrated in FIG. 2, binary-to-control signal converter 200 may generate two corresponding control signals 204-206 based on binary input signal 102. Binary-to-control signal converter 200 may be any digital circuit capable of generating control signals 204-206 based on the received binary input signal 102. In some embodiments, binary-to-control signal converter 200 may include a digital circuit that utilizes a lookup table having entries that define one or more relationships between a binary input signal 102 and control signals 204-206 to select and generate control signals 204-206 based on a received binary input signal 102. In some embodiments, control signals 204-206 generated by binary-to-control signal converter 200 may include a 3-bit column control signal 206 comprising bits [$C_2, C_1, C_0$] and a 3-bit row control signal 204 comprising bits [$R_2, R_1, R_0$]. Column control signal 206 and row control signal 204 are provided to thermo-decoder 202 as inputs. Based on the received column control signal 206 and row control signal 204, thermo-decoder 202 generates a corresponding thermo-code output [$U_{9\_en}, U_{8\_en}, U_{7\_en}, U_{6\_en}, U_{5\_en}, U_{4\_en}, U_{3\_en}, U_{2\_en}, U_{1\_en}$]104. In the context of this specification, embodiments wherein thermo-decoder 202 generates a 9-bit thermo-code output 104 are described. In some embodiments, however, thermo decoder 202 may generate a thermo-code output of any bit length.

Table 1, included below, illustrates an exemplary relationship between a three-bit binary input signal [$B_2, B_1, B_0$] 102 and thermo-code output [$U_{9\_en}, U_{8\_en}, U_{7\_en}, U_{6\_en}, U_{5\_en}, U_{4\_en}, U_{3\_en}, U_{2\_en}, U_{1\_en}$] 104, consistent with some embodiments of the present invention. Table 1 also illustrates an exemplary relationship between input binary signal [$B_2, B_1, B_0$] 102 and column controls signal [$C_2, C_1, C_0$] 206 and row control signal [$R_2, R_1, R_0$] 204.

TABLE 1

| Binary Input [$B_2, B_1, B_0$] | Column Control Signal [$C_2, C_1, C_0$] | Row Control Signal [$R_2, R_1, R_0$] | Thermo-Code Output [$U_{9\_en}$-$U_{1\_en}$] |
|---|---|---|---|
| [000] | [000] | [000] | [000000000] |
| [001] | [001] | [001] | [000000001] |
| [010] | [001] | [011] | [000000011] |
| [011] | [001] | [111] | [000000111] |
| [100] | [011] | [001] | [000001111] |
| [101] | [011] | [011] | [000011111] |
| [110] | [011] | [111] | [000111111] |
| [111] | [111] | [001] | [001111111] |

In some embodiments of the invention described herein, other relationships between binary input signal 102, column control signal 206, row control signal 204, and thermo-code output 104 may be utilized. For example, other embodiments of the invention can include different numbers of input bits or may include different numbers of control bits.

Figure 3:
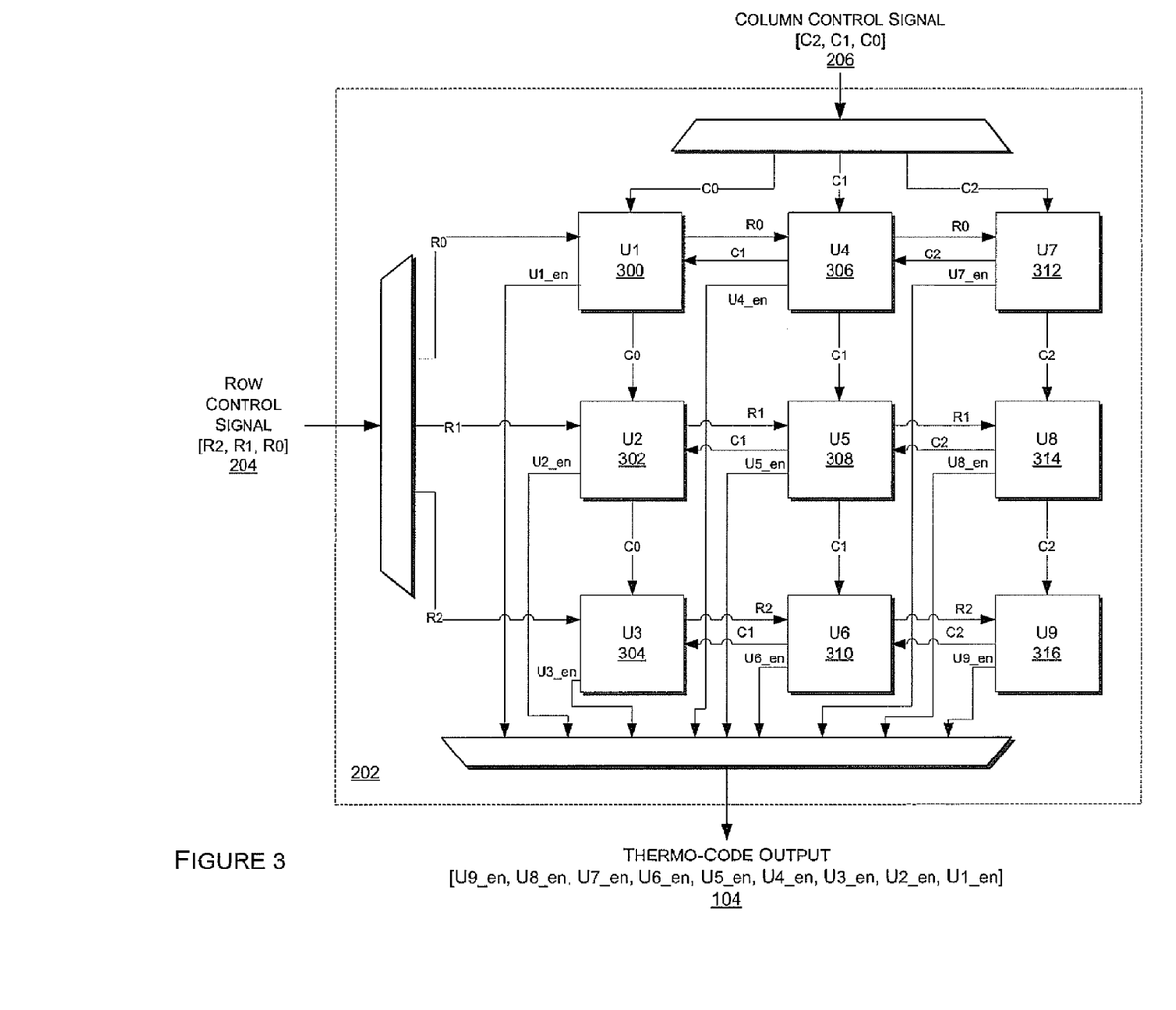
FIG. 3 illustrates a schematic diagram of a thermo-decoder circuit consistent with some embodiments of the present invention.

FIG. 3 illustrates a schematic diagram of a thermo-decoder circuit 202 consistent with some embodiments of the present invention for a 3-bit input signal 102. As described above, thermo-decoder circuit 202 receives a 3-bit column control signal 206 comprising bits [$C_2, C_1, C_0$] and a 3-bit row control signal 204 comprising bits [$R_2, R_1, R_0$], which are generated as a result of 3-bit input signal 102, and generates a corresponding thermo-code output [$U_{9\_en}, U_{8\_en}, U_{7\_en}, U_{6\_en}, U_{5\_en}, U_{4\_en}, U_{3\_en}, U_{2\_en}, U_{1\_en}$]104. In some embodiments, thermo-decoder circuit 202 may receive column and row control signals of any bit lengths necessary to generate a corresponding thermo-code output in response to a binary input signal having any number of bits.

Thermo-decoder circuit 202 includes decoder circuit blocks U1-U9 300-316. Circuit block U1 300 receives as inputs column control signal $C_0$, row control signal $R_0$, and column control signal $C_1$, and provides column control signal $C_0$, row control signal $R_0$, and U1 enable signal U1_en as outputs. Circuit block U2 302 receives as inputs column control signal $C_0$, row control signal $R_1$, and column control signal $C_1$, and provides column control signal $C_0$, row control signal $R_1$, and U2 enable signal U2_en as outputs. Circuit block U3 304 receives as inputs column control signal $C_0$, row control signal $R_2$, and column control signal $C_1$, and provides row control signal $R_2$ and U3 enable signal U3_en as outputs. Circuit block U4 306 receives as inputs column control signal $C_1$, row control signal $R_0$, and column control signal $C_2$, and provides column control signal $C_1$, row control signal $R_0$, and U4 enable signal U4_en as outputs. Circuit block U5 308 receives as inputs column control signal $C_1$, row control signal $R_1$, and column control signal $C_2$, and provides column control signal $C_1$, row control signal $R_1$, and U5 enable signal U5_en as outputs. Circuit block U6 310 receives as inputs column control signal $C_1$, row control signal $R_2$, and column control signal $C_2$, and provides column control signal $C_1$, row control signal $R_2$, and U6 enable signal U6_en as outputs. Circuit block U7 312 receives as inputs column control signal $C_2$ and row control signal $R_0$ and provides column control signal $C_2$ and U7 enable signal U7_en as outputs. Circuit block U8 314 receives as inputs column control signal $C_2$ and row control signal $R_1$ and provides column control signal $C_2$ and U8 enable signal U8_en as outputs. Finally, circuit block U9 316 receives as inputs column control signal $C_2$ and row control signal $R_2$ and provides column control signal $C_2$ and U9 enable signal U9_en as outputs.

Enable signals U1_en-U9_en are collectively output as thermo-code output [$U_{9\_en}, U_{8\_en}, U_{7\_en}, U_{6\_en}, U_{5\_en}, U_{4\_en}, U_{3\_en}, U_{2\_en}, U_{1\_en}$] 104 (e.g., each enable signal represents a corresponding bit of the thermo-code output 104). In some embodiments, the relationship between column control signal [$C_2, C_1, C_0$] 206, row control signal [$R_2, R_1, R_0$], 204, and thermo-code output [$U_{9\_en}, U_{8\_en}, U_{7\_en}, U_{6\_en}, U_{5\_en}, U_{4\_en}, U_{3\_en}, U_{2\_en}, U_{1\_en}$] 104 is consistent with the exemplary relationship described above in Table 1. In some embodiments, decoder circuit blocks U1-U9 300-316 may be any digital circuit(s) capable of implementing the same or similar input/output behavior detailed in Table 1. However, as previously noted, in some embodiments, other relationships between column control signal 206, row control signal 204, and thermo-code output 104 may be utilized that enable similar functionality.

As described above, FIG. 3 illustrates an exemplary thermo-decoder circuit 202 that includes a 3×3 array of decoder circuit blocks 300-316. Principles consistent with embodiments of the invention, however, may be implemented in any m×n array of decoder circuit blocks having m columns and n rows where m and n are positive integers. In an m×n thermo-decoder circuit, a maximum thermo-code output resolution of m×n bits may be achieved. In design integrations where an output resolution lower than the maximum output resolution is sufficient, however, some of the most significant bits ("MSB") of the thermo-code output may not be utilized (e.g., $U_{m \times n\_en}$ may not be utilized). In some embodiments, m and n may be the same positive integer. However, in some embodiments, m and n may be different positive integers. For example, a 10-bit binary input signal may utilize 1024 decoder circuit blocks, which may be implemented in a 32×32 array or, alternatively, in a 16×64 array. In the aforementioned manner, the output resolution and layout configuration of the thermo-decoder circuit may be designed in accordance with particular application requirements.

In a thermo-decoder circuit that includes an m×n array of decoder circuit blocks, the n decoder circuit blocks corresponding with the n least significant bits ("LSBs") of the thermo-code output (e.g., circuit blocks U1, U2, and U3 of thermo-decoder circuit 202) may be referenced as LSB decoder circuit blocks. Similarly, the n decoder circuit blocks corresponding with the n MSBs of the thermo-code output (e.g., circuit blocks U7, U8, and U9 of thermo-decoder circuit 202) may be referenced as MSB decoder blocks. Finally, the (m−2)·n circuit blocks corresponding to the decoder circuit blocks between the n LSB decoder blocks and the n MSB decoder blocks (e.g., circuit blocks U4, U5, and U6 of thermo-decoder circuit 202) may be referenced as intermediary decoder circuit blocks. In some embodiments, if not all of the n MSBs of the thermo-code output are utilized, the decoder circuit blocks corresponding to the unused bits may be absent from decoder 202. Further, in some embodiments, the unused bits and/or the corresponding decoder circuit blocks may be tied to a particular binary state.

Figure 4:
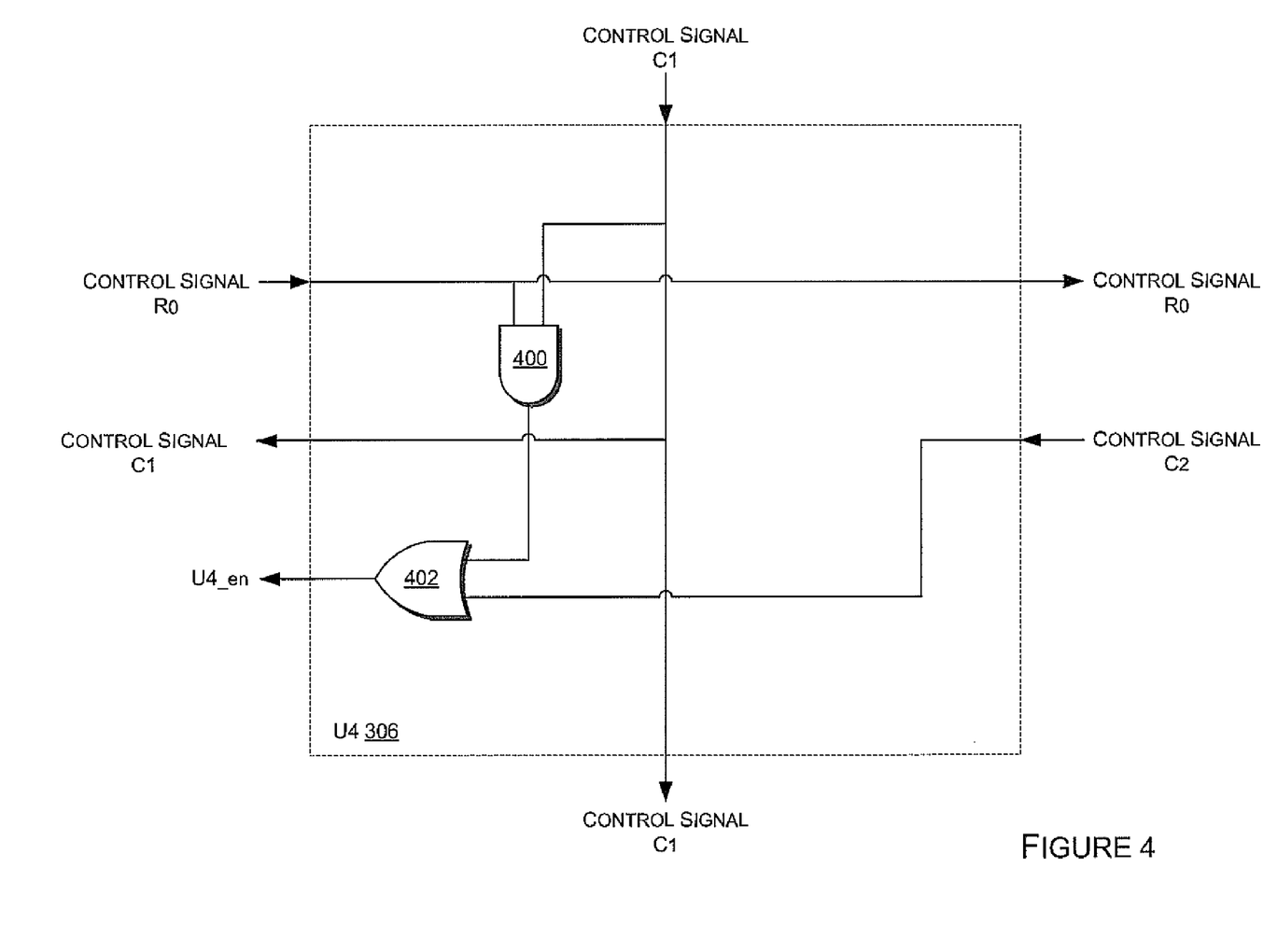
FIG. 4 illustrates a schematic diagram of a decoder circuit block consistent with some embodiments of the present invention.

FIG. 4 illustrates a schematic diagram of a decoder circuit block 306 consistent with some embodiments of the present invention. Particularly, FIG. 4 illustrates a more detailed diagram of decoder circuit block U4 306 of thermo-decoder circuit 202 illustrated in FIG. 3 and described above. As illustrated in FIG. 4, decoder circuit block U4 306 includes AND gate 400 and OR gate 402. In some embodiments, AND gate 402 may be any digital circuit that is configured to perform a logical AND operation on a plurality of inputs. Similarly, in some embodiments, OR gate 402 may be any digital circuit that is configured to perform a logical OR operation on a plurality of inputs.

Decoder circuit block U4 306 receives column control signal $C_1$, row control signal $R_0$, and column control signal $C_2$ as inputs, and outputs column control signal $C_1$, row control signal $R_0$, and U4 enable signal U4_en. Column control signal $C_1$ and row control signal $R_0$ are coupled to AND gate 400 as inputs. Column control signal $C_2$ and the output of AND gate 400 are coupled to OR gate 402 as inputs. The output of OR gate 402 provides decoder circuit block U4 306 enable signal U4_en.

Based on the above-described configuration of decoder circuit block U4 306, enable signal U4_en is asserted (e.g., set to a logical one value) when both control signal $R_0$ and control signal $C_1$ are asserted (e.g., the output of AND gate is set to a logical one value). Regardless of the signal levels of control signal $R_0$ and control signal $C_1$, however, if control signal $C_2$ is asserted, enable signal U4_en is asserted. In this manner, enable signal U4_en is asserted whenever both control signal $R_0$ and control signal $C_1$ are asserted or control signal $C_2$ is asserted.

The internal configuration of each of decoder circuit blocks (e.g., U1-U9 300-316 shown in FIG. 3) may be dependent on the inputs/outputs associated with other decoder circuit blocks. The configuration of decoder circuit block U4 306 described above is consistent with the configuration of the intermediary decoder circuit blocks (e.g., circuit blocks U4, U5, and U6 of thermo-decoder circuit 202) of a thermo-decoder circuit that includes an m×m array of decoder circuit blocks. Accordingly, the LSB decoder circuit blocks of the m×m array (e.g., circuit blocks U1, U2, and U3) may be configured similarly to the intermediary decoder circuit blocks, but may be modified to account for their respective inputs/outputs. As shown in FIG. 3, the LSB decoder circuit blocks receive their corresponding row/column control signals and the adjacent column control signal as inputs and output an enable signal and their corresponding column control signal to the adjacent LSB decoder block within the same column (e.g., for decoder circuit block $U_1$, $C_0$, $R_0$, and $C_1$, are received as inputs and $C_0$ and U1_en are provided as outputs). Therefore, in contrast to the intermediary decoder circuit blocks, the LSB decoder circuit blocks may be configured such that their corresponding column control signal (e.g., $C_0$ for decoder circuit block U1) is provided only to the adjacent decoder circuit block within the same column.

Similar to the exemplary configuration of the LSB decoder circuit blocks described above, the MSB decoder circuit blocks of an m×m array (e.g., U7-U9 312-316) may be configured like the intermediary decoder circuit blocks (e.g., U4 306 illustrated in FIG. 4), but may be modified based on their corresponding inputs/outputs. For example, each MSB decoder circuit block receives only their corresponding row/column controls (e.g., $R_0$ and $C_2$ for decoder circuit block U7) as inputs and provides their column control signal to both the adjacent intermediary decoder circuit block within the same row and the adjacent MSB decoder block within the same column as well as the corresponding output enable signal as outputs. Accordingly, in some embodiments, MSB circuit blocks are configured to assert an output enable signal only when their corresponding column and row control signals are asserted. Therefore, an MSB decoder block may be configured such that the input of the OR gate shown in the exemplary intermediary circuit block illustrated in FIG. 4 that would otherwise be tied to the adjacent column control signal in an intermediary circuit block is tied to ground.

Figures 5A, 5B:
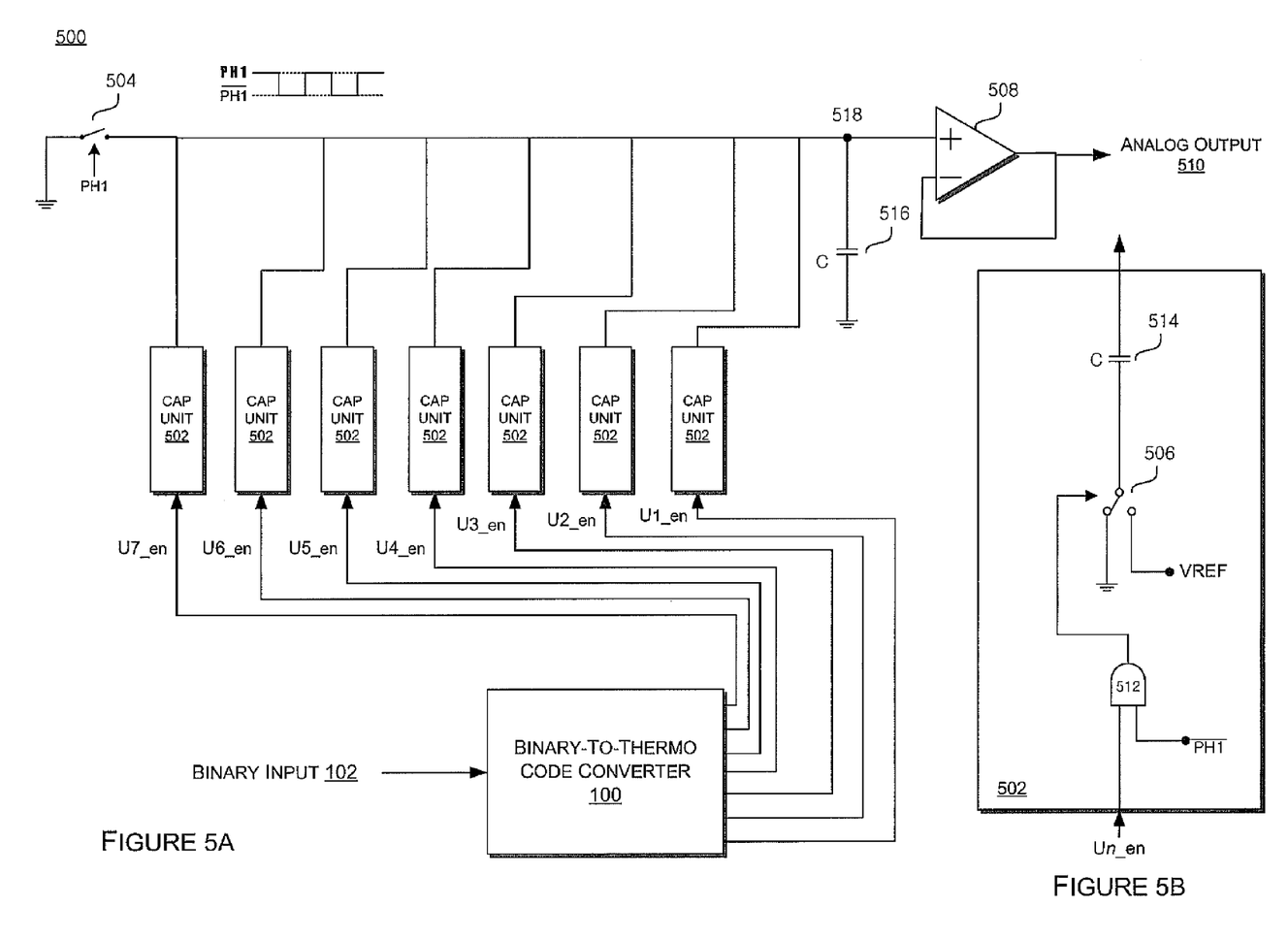
FIGS. 5A and 5B illustrate a digital-to-analog converter ("DAC") integrating a binary-to-thermo code converter consistent with some embodiments of the present invention.

FIG. 5A illustrates a digital-to-analog converter ("DAC") 500 integrating a binary-to-thermo code converter 100 consistent with some embodiments of the present invention. DAC 500 includes switch 504, an array of switched capacitor units 502, binary-to-thermo code converter 100, terminating capacitor 516, and amplifier 508. Binary-to-thermo code converter 100 is configured to convert binary input 102 into a corresponding thermo-code output (e.g., [$U_{7\_en}$, $U_{6\_en}$, $U_{5\_en}$, $U_{4\_en}$, $U_{3\_en}$, $U_{2\_en}$, $U_{1\_en}$]). The thermo-code output signal of binary-to-thermo code converter is provided to the array of switched capacitor units 502. The output of each of switched capacitor units 502 is coupled to circuit node 518. Switch 504 is configured to either couple or decouple circuit node 518 to ground. Terminating capacitor 516 is coupled between circuit node 518 and ground. Finally, circuit node 518 is coupled to the non-inverting terminal of amplifier 508.

As shown in FIG. 5A, the thermo-code output signal may be a 7-bit thermo-code signal that includes enable signals generated by decoder circuit blocks (e.g., U1-U9 illustrated in FIG. 3) of binary-to-thermo code converter 100. As previously discussed, in some embodiments the output thermo-code resolution of binary-to-thermo code converter 100 may be designed in accordance with particular application requirements. For example, an exemplary binary-to-thermo code converter 100 may be capable of generating a 9-bit thermo-code output, but only the 7 LSBs of the 9 total bits may be utilized in a particular application. Furthermore, the output resolution of binary-to-thermo code converter 100 may include a thermo-code output of any bit length, and the design of DAC 500 described herein may be modified to accommodate varied thermo-code resolutions.

The thermo-code output of binary-to-thermo code converter 100 illustrated in FIG. 5A includes enable signals [$U_{7\_en}$, $U_{6\_en}$, $U_{5\_en}$, $U_{4\_en}$, $U_{3\_en}$, $U_{2\_en}$, $U_{1\_en}$]. Each of enable signals U1_en-U7_en is provided to one of switched capacitor units 502 as an input. Switched capacitor units 502 may be switched either "on" or "off" based at least in part on their respective enable signals. In some embodiments, the number of switched capacitor units 502 is dependent on the bit resolution of the thermo-code output of binary-to-thermo code converter 100.

The schematic diagram shown in FIG. 5B illustrates an exemplary switched capacitor unit circuit 502 consistent with some embodiments of the present invention. Switched capacitor unit 502 includes signal driven switch 506, capacitor 514, and AND gate 512. The top plate of capacitor 514 provides the output of each switched capacitor unit 502 and is coupled to circuit node 518. The output of AND gate 514 provides a signal capable of driving signal driven switch 506 to a particular orientation. As illustrated, signal driven switch 506 may be configured such that the bottom plate of capacitor 512 coupled to signal driven switch 506 may, depending on its orientation, be coupled to either ground or a reference voltage Vref.

Prior to generation of an n-bit thermo-code word including n enable signals by binary-to-thermo code converter 100 in response to receiving binary input 102, switch 504 may be closed, thereby coupling the top plates of switched capacitor unit capacitors 514, terminating capacitor 516, and the non-inverting input of amplifier 508 to ground. In some embodiments, the duration of time that switch 504 is closed may be related to the discharge time(s) of switched capacitor unit capacitors 514 and or terminating capacitor 516. Similarly, prior to receiving an n-bit thermo-code word, signal driven switches 506 of switched capacitor units 502 may be switched to ground, thereby coupling to bottom plates of switched capacitor unit capacitors 514 to ground. In some embodiments, the duration of time that signal driven switches 506 are oriented such that the bottom plates of switched capacitor unit capacitors 514 are coupled to ground may be related to the discharge time(s) of the switched capacitor unit capacitors 514.

Upon generation of an n-bit thermo-code word by binary-to-thermo code converter 100 in response to receiving binary input 102, signal driven switches 506 of switched capacitor units 506 may be switched from ground to referenced voltage Vref depending on the value of the bits in the generated thermo-code word corresponding with switched capacitor units 502. For example, in DAC 500 illustrated in FIG. 5A, wherein the two LSBs of thermo-code output [$U_{7\_en}$, $U_{6\_en}$, $U_{5\_en}$, $U_{4\_en}$, $U_{3\_en}$, $U_{2\_en}$, $U_{1\_en}$] have binary values of one and all other bits have binary values of zero (i.e., thermo-code output [0000011]), the two signal driven switches 506 of switched capacitor units 502 receiving $U_{2\_en}$ and $U_{1\_en}$ may be switched to reference voltage Vref, thereby coupling the bottom plate of capacitors 514 of the two enabled switch capacitor units 502 to Vref. Similarly, the signal driven switches 506 of the switched capacitor units 502 receiving Un_en enable signals having digital values of zero may remain switched to ground such that the bottom plates of all capacitors 514 coupled to such bit switches also remain coupled to ground.

In some embodiments, switch 504 and switched capacitor unit switches 506 may be driven by a pair of non-overlapping clock signals denoted as PH1 and $\overline{\text{PH1}}$. As illustrated in FIG. 5A, switch 504 may be driven by clock signal PH1. Similarly, switched capacitor unit switches 506 may be operate according to clock signal $\overline{\text{PH1}}$. When PH1 is at a high logic level and $\overline{\text{PH1}}$ is at a low logic level, switch 504 may be closed and switched capacitor unit switches 506 may be oriented such that the bottom plate of capacitors 514 are coupled to ground. Similarly, when PH1 is at a low logic level and $\overline{\text{PH1}}$ is at a high logic level, switch 504 may be opened and switched capacitor unit switches 506 may be oriented according to the values of the bits of the thermo-code output signal [$U_{7\_en}$, $U_{6\_en}$, $U_{5\_en}$, $U_{4\_en}$, $U_{3\_en}$, $U_{2\_en}$, $U_{1\_en}$] associated with each of switched capacitor units 502. As illustrated in FIG. 5B, this functionality may be implemented using a digital circuit configured to perform a logical AND operation (e.g., an AND gate) on clock signal $\overline{\text{PH1}}$ and the values of the bits of the thermo-code output corresponding respectively with switched capacitor units 502 (i.e., the values of bits $U_{7\_en}$, $U_{6\_en}$, $U_{5\_en}$, $U_{4\_en}$, $U_{3\_en}$, $U_{2\_en}$, and $U_{1\_en}$) to generate corresponding enable signals for switched capacitor unit switches 506.

In some embodiments, clock signal PH1 may be set to a high logic level during a reset phase of DAC 500. Similarly, in certain embodiments, clock signal $\overline{\text{PH1}}$ may be set to a high logic level during a sampling phase of DAC 400.

Based on the above described operation of DAC 500, reference voltage Vref may be capacitively attenuated at node 518 to a level which is dependent upon the configuration of switched capacitor units 502 and terminating capacitor 516, which form, in effect, a variable capacitive voltage divider, Accordingly, the voltage at node 518 may be given by:

$$V(node_{418}) = \frac{U_{1\_en} + U_{2\_en} + \ldots + U_{n-1\_en} + U_{n\_en}}{n+1} V_{ref}$$

wherein $U_{1\_en}$ is the binary level of the LSB of the thermo-code output generated by binary-to-thermo code converter 100, $U_{n\_en}$ is the binary level of the MSB of the thermo-code output, n is the number of bits of the thermo-code output, and Vref is the reference voltage. Accordingly, the voltage level at node 518 is scaled by DAC 500 based on the converted thermo-code representation of binary input 102. In some embodiments, as shown in FIG. 5A, the voltage at node 518 may be buffered using amplifier 508 placed in a negative feedback loop configuration to generate analog output 510.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A binary-to-thermometer-code converter, comprising:
    a binary-to-control signal converter that generates a column control signal and a row control signal based on a binary input signal and a lookup table; and
    a control signal-to-thermometer-code decoder that includes an array of decoder circuit blocks coupled to receive the column control signal and the row control signal,
    wherein each of the decoder circuit blocks determine at least one bit of the thermometer-code output signal based on at least a first bit of the column control signal.

2. The binary-to-thermometer-code converter of claim 1, wherein each of the decoder circuit blocks determine at least one bit of the thermometer-code based further on at least one bit of the row control signal.

3. A binary-to-thermometer-code converter comprising:
    a binary-to-control signal converter that generates a column control signal and a row control signal based on a binary input signal; and
    a control signal-to-thermometer-code decoder that includes an array of decoder circuit blocks coupled to receive the column control signal and the row control signal,
    wherein each of the decoder circuit blocks determine at least one bit of the thermometer-code output signal based on at least a first bit of the column control signal; and
    each of the decoder circuit blocks determine at least one bit of the thermometer-code based further on at least one bit of the row control signal; and
    wherein at least one of the decoder circuit blocks receives a second bit of the column control signal and is capable of determining at least one bit of the thermometer code output signal based further on a second bit of the column control signal.

4. The binary-to-thermometer-code converter of claim 1, wherein the array includes an m×n array of decoder circuit blocks having m columns and n rows.

5. The binary-to-thermometer-code converter of claim 4 wherein the column control signal comprises m bits.

6. A binary-to-thermometer-code converter comprising:
a binary-to-control signal converter that generates a column control signal and a row control signal based on a binary input signal; and
a control signal-to-thermometer-code decoder that includes an array of decoder circuit blocks coupled to receive the column control signal and the row control signal,
wherein each of the decoder circuit blocks determine at least one bit of the thermometer-code output signal based on at least a first bit of the column control signal; wherein
the array includes an m×n array of decoder circuit blocks having m columns and n rows; and
the column control signal comprises m bits; and
wherein the j-th bit of the column control signal is provided to the j-th column of the m×n array of decoder circuit blocks.

7. The binary-to-thermometer-code converter of claim 6, wherein the (j+1)-th bit of the column control signal is provided to the j-th column of the m×n array of decoder circuit blocks.

8. The binary-to-thermometer-code converter of claim 7, wherein the row control signal comprises n bits.

9. The binary-to-thermometer-code converter of claim 8, wherein the i-th bit of the row control signal is provided to the i-th row of the m×n array of decoder circuit blocks.

10. The binary to thermometer-code converter of claim 9, wherein the [(j−1)*n+1]-th bit of the thermometer-code output signal is determined by the decoder circuit block in the j-th column and the i-th row according to:
[i-th bit of row control signal AND j-th bit of column control signal]
OR (j+1)-th bit of the column control signal.

11. The binary-to-thermometer-code converter of claim 1, wherein the column control signal and the row control signal are generated by the binary-to-control signal converter based on a predefined relationship between the binary input signal and the generated column and row control signals.

12. A binary-to-analog converter comprising:
a binary-to-control signal converter that generates a column control signal and a row control signal based on a binary input signal and a lookup table;
a control signal-to-thermometer-code decoder that includes an array of decoder circuit blocks coupled to receive the column control signal and the row control signal, wherein each of the decoder circuit blocks determine at least one bit of the thermometer-code output signal based on at least one bit a first bit of the column control signal; and
a thermometer-code-to analog converter coupled to receive the thermometer-code output signal and generate a corresponding analog output signal.

13. The binary-to-analog converter of claim 12, wherein each of the decoder circuit blocks determine at least one bit of the thermometer-code based further on at least one bit of the row control signal.

14. A binary-to-analog converter comprising:
a binary-to-control signal converter that generates a column control signal and a row control signal based on a binary input signal;
a control signal-to-thermometer-code decoder that includes an array of decoder circuit blocks coupled to receive the column control signal and the row control signal, wherein each of the decoder circuit blocks determine at least one bit of the thermometer-code output signal based on at least one bit a first bit of the column control signal; and
each of the decoder circuit blocks determine at least one bit of the thermometer-code based further on at least one bit of the row control signal; and
a thermometer-code-to analog converter coupled to receive the thermometer-code output signal and generate a corresponding analog output signal; and
wherein at least one of the decoder circuit blocks receives a second bit of the column control signal and is capable of determining at least one bit of the thermometer code output signal based further on a second bit of the column control signal.

15. The binary-to-analog converter of claim 12, wherein the array includes an m×n array of decoder circuit blocks having m columns and n rows.

16. The binary-to-analog converter of claim 15, wherein the column control signal comprises m bits.

17. A binary-to-analog converter comprising:
a binary-to-control signal converter that generates a column control signal and a row control signal based on a binary input signal; and
a control signal-to-thermometer-code decoder that includes an array of decoder circuit blocks coupled to receive the column control signal and the row control signal,
wherein each of the decoder circuit blocks determine at least one bit of the thermometer-code output signal based on at least a first bit of the column control signal; and a thermometer-code-to analog converter coupled to receive the thermometer-code output signal and generate a corresponding analog output signal; wherein
the array includes an m×n array of decoder circuit blocks having m columns and n rows; and
the column control signal comprises m bits; and
wherein the j-th bit of the column control signal is provided to the j-th column of the m×n array of decoder circuit blocks.

18. The binary-to-analog converter of claim 17, wherein the (j+1)-th bit of the column control signal is provided to the j-th column of the m×n array of decoder circuit blocks.

19. The binary-to-analog converter of claim 18, wherein the row control signal comprises n bits.

20. The binary-to-analog converter of claim 19, wherein the i-th bit of the row control signal is provided to the i-th row of the in m×n array of decoder circuit blocks.

21. The binary to thermometer-code converter of claim 20, wherein the [(j−1)*n+1]-th bit of the thermometer-code output signal is determined by the decoder circuit block in the j-th column and the i-th row according to:
[i-th bit of row control signal AND j-th bit of column control signal]
OR (j+1)-th bit of the column control signal.

22. The binary-to-thermometer-code converter of claim 21, wherein the column control signal and the row control signal are generated by the binary-to-control signal converter based on a predefined relationship between the binary input signal and the generated column and row control signals.

23. A binary-to-analog converter comprising:
a binary-to-control signal converter that generates a column control signal and a row control signal based on a binary input signal;
a control signal-to-thermometer-code decoder that includes an array of decoder circuit blocks coupled to receive the column control signal and the row control signal, wherein each of the decoder circuit blocks determine at least one bit of the thermometer-code output signal based on at least one bit a first bit of the column control signal; and
a thermometer-code-to analog converter coupled to receive the thermometer-code output signal and generate a corresponding analog output signal; and
wherein the thermometer-code-to analog converter comprises a switched capacitor array.

24. A method comprising:
generating, based on a received digital signal and a lookup table, a column control signal and a row control signal; and
generating, utilizing a control signal-to-thermometer-code decoder that includes an array of decoder circuit blocks coupled to receive the column control signal and row control signal, a thermometer-code output signal based on at least a first bit of the column control signal.

25. A method comprising:
generating, based on a received digital signal, a column control signal and a row control signal; and
generating, utilizing a control signal-to-thermometer-code decoder that includes an array of decoder circuit blocks coupled to receive the column control signal and row control signal, a thermometer-code output signal based on at least a first bit of the column control signal; and
generating, utilizing a thermometer-code-to analog converter, an analog signal based on the thermometer-code output signal.

26. A method comprising:
generating, based on a received digital signal and a lookup table, a column control signal and a row control signal; and
generating, utilizing a control signal-to-thermometer-code decoder that includes an array of decoder circuit blocks coupled to receive the column control signal and row control signal, a thermometer-code output signal based on at least a first bit of the column control signal; wherein
the step of generating the column control signal and row control signal is performed using a lookup table that includes entries that define one or more relationships between a set of predetermined digital signals and a set of predetermined row and column control signals.

27. A method comprising:
generating, based on a received digital signal and a lookup table, a column control signal and a row control signal; and
generating, utilizing a control signal-to-thermometer-code decoder that includes an array of decoder circuit blocks coupled to receive the column control signal and row control signal, a thermometer-code output signal based on at least a first bit of the column control signal;
wherein the thermometer-code to analog converter includes a switched capacitor array.

* * * * *